United States Patent [19]
Hoover

[11] Patent Number: 5,341,090
[45] Date of Patent: Aug. 23, 1994

[54] BIDIRECTIONAL, TRANSCONDUCTANCE, DC AMPLIFIER HAVING HIGH OUTPUT COMPLIANCE VOLTAGE

[75] Inventor: James M. Hoover, Galloway, Ohio

[73] Assignee: Scientific Columbus Co., Columbus, Ohio

[21] Appl. No.: 959,122

[22] Filed: Oct. 9, 1992

[51] Int. Cl.$^5$ ............................................. H03F 3/45
[52] U.S. Cl. ........................... 324/123 R; 324/123 C; 324/713; 330/252; 330/260
[58] Field of Search ............... 323/316; 330/105, 146, 330/252, 260; 324/120, 123 R, 123 C, 158 R, 713; 307/530, 359

[56] References Cited

U.S. PATENT DOCUMENTS

| | | | |
|---|---|---|---|
| 3,588,530 | 6/1971 | Langan | 330/252 X |
| 4,290,024 | 9/1981 | Yokoyama | 330/105 X |
| 4,390,848 | 6/1983 | Blauschild | 330/252 X |
| 4,495,462 | 1/1985 | Weldon | 324/120 |
| 4,528,514 | 7/1985 | Quackenbush | 330/146 |
| 4,689,607 | 8/1987 | Robinson | 323/316 X |
| 4,965,529 | 10/1990 | Laug | 330/255 |
| 5,191,297 | 3/1993 | Penman et al. | 330/146 |

OTHER PUBLICATIONS

Chung et al; "A Linear Operational Transconductance Amplifier for Instrumentation Applications"; Jun. 1992; pp. 441-443.

Primary Examiner—Kenneth A. Wieder
Assistant Examiner—Christopher M. Tobin
Attorney, Agent, or Firm—Frank H. Foster

[57] ABSTRACT

A bidirectional, transconductance, DC amplifier exhibiting a compliance voltage exceeding either of the DC power supply voltages nearly double the compliance voltage of conventional circuits. The circuit uses a differential input operational amplifier. A voltage divider has its first resistor connected between the amplifier input and the noninverting input of the operational amplifier. The second resistor of the voltage divider is connected between the noninverting input and a common ground. A third resistor is connected between the amplifier input and the inverting input of the operational amplifier. A feedback circuit branch is connected between the inverting input and the output of the operational amplifier and includes a pair of output terminals for connecting the load in series in the feedback circuit branch.

10 Claims, 2 Drawing Sheets

BIDIRECTIONAL, TRANSCONDUCTANCE, DC AMPLIFIER HAVING HIGH OUTPUT COMPLIANCE VOLTAGE

TECHNICAL FIELD

This invention relates generally to electronic circuitry useful for metering in the electrical power industry, and more particularly relates to amplifier circuitry, particularly useful in electrical transducers for enhancing the output characteristics.

BACKGROUND ART

In transducer circuitry for electrical power metering, it is often desired to provide an output signal current which is proportional to an input parameter such as input voltage or current or real or reactive power in order to use that output current for metering or subsequent operations.

Typically this is accomplished by connecting the primary of a step-down transformer in the electrical power circuitry to sense instantaneous voltage or current and provide a relatively low power voltage or current signal at its secondary. Such a voltage or current transformer scales the high voltages and currents of the electrical power circuitry, down to lower levels for use by small signal circuitry. The scaled signal is then conditioned by intermediate circuitry, the function of which usually includes conversion to a DC signal which is proportional to the input parameter which it is desired to meter. This DC signal is then applied to an output stage.

For example, the conditioning and conversion to a DC signal might be accomplished by rectifying and filtering the signal from the secondary of a voltage or current transformer to derive a DC signal which is proportional to the input voltage or current. Alternatively, the conditioning can involve a conventional multiplier circuit having both an input voltage signal and an input current signal for deriving the real power in watts or the reactive power in vats.

It is desirable that the output stage amplifier have a high output impedance so that it operates as a current source in which the output signal is dependent upon the input parameter represented by the DC signal, but not dependent upon the impedance of the load which it drives.

Conventional op-amp amplifiers typically used as the output stage are limited, however, in their operation by their compliance voltage. The compliance voltage of such an amplifier is the absolute value of the maximum output voltage to which the output of the op amp can go and still provide an accurate output current which is a linear function of the input signal. Thus, the compliance voltage is the maximum voltage at which the output still appears as a current source, accurately obeying the desired transfer function for the amplifier.

Therefore, the product of the maximum or full scale output current for the design range of operation, multiplied by the maximum load impedance which may be used can not exceed the compliance voltage. Consequently, the compliance voltage imposes a limitation upon the maximum load impedance and the maximum load current which may be used.

In the operational amplifier circuits which have been used by the prior art, the compliance voltage is limited to a voltage which is less than the power supply voltage. Typically, for example, an amplifier having a power supply voltage of ±15 volts will have a compliance voltage on the order of ±10 or ±11 volts.

It is an object and feature of the present invention to provide an operational amplifier circuit which substantially increases, nearly doubling, the compliance voltage. This increase in the compliance voltage permits an increase in the current range or load impedance or both with which this circuit may be operated.

BRIEF DISCLOSURE OF THE INVENTION

The invention is a bidirectional, transconductance mode DC amplifier, exhibiting a compliance voltage exceeding either of the DC power supply voltages. The amplifier utilizes a differential input operational amplifier. A voltage divider has a first impedance connected between the amplifier input and the noninverting input of the operational amplifier. The second impedance of the voltage divider is connected between the noninverting input and a common ground. A third impedance is connected between the amplifier input and the inverting input of the operational amplifier. A feedback circuit branch is connected between the inverting input and the output of the operational amplifier. The feedback circuit branch includes a pair of output terminals for connecting a load in series in the feedback circuit branch.

Figure 1:
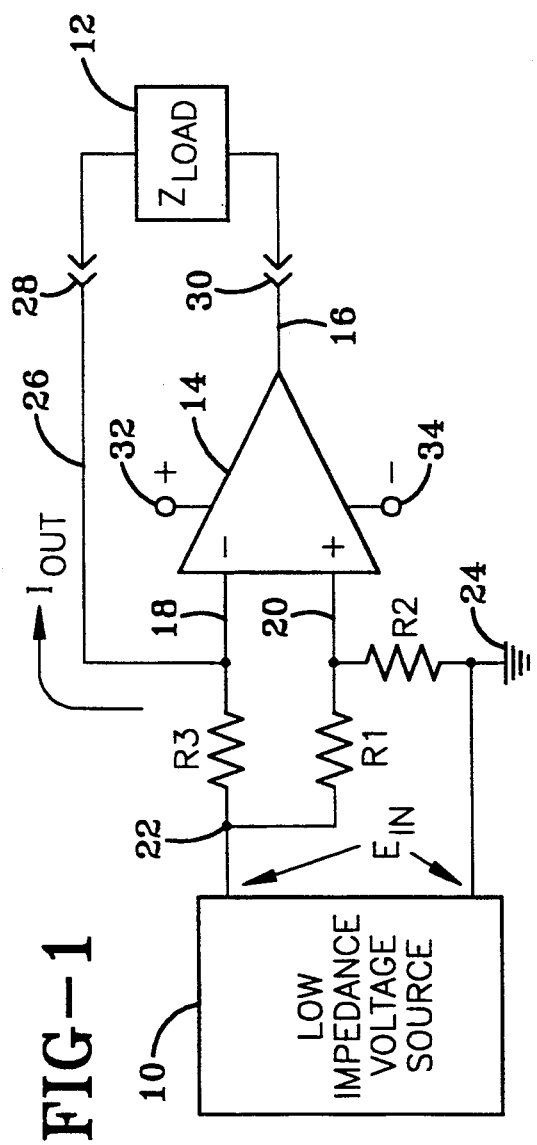
FIG. 1 is a simplified schematic diagram illustrating the invention.

In describing the embodiments of the invention which are illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art.

DETAILED DESCRIPTION

FIG. 1 illustrates the principal components of the present invention. The circuit is a bidirectional, DC, transconductance amplifier. The term "DC amplifier" means that the circuit will amplify both signals which are time varying at a very low frequency as well as typical low frequency AC signals, such as those encountered in electrical power metering circuitry. The circuit is a transconductance amplifier, taking its voltage input from the output of a low impedance voltage source 10, such as the DC output from signal conditioning circuitry, and providing an apparent high impedance, current source output to the load 12. It is bidirectional or bipolar because the output current can flow in the load in either direction with its amplitude and current flow direction controlled by the input signal. As is well known to those skilled in the art, the term "voltage source" defines a circuit which approximates an ideal voltage source because its Thevinin and Norton equivalent circuits have a low internal impedance which is considerably lower than the load impedance and, as a result, its output voltage is essentially identical to the voltage of the ideal voltage source of its equivalent circuit and is not a function of its load impedance. A "current source" is a source having a high impedance in its equivalent circuit so that its output current is not a function of the load impedance.

The circuit of the present invention uses a differential input, operational amplifier 14 having an output 16, an inverting input 18 and a noninverting input 20. A voltage divider consisting of resistors R1 and R2 is connected between an amplifier input terminal 22 and a common ground 24. The first leg of the voltage divider is a resistor R1 which is connected between the input terminal 22 and the noninverting input 20 of the operational amplifier. The second leg of the voltage divider is a resistor R2 which is connected between the noninverting input 20 and the common ground 24. A third resistor R3 is connected between the amplifier input 22 and the inverting input 18 of the operational amplifier 14. A feedback circuit branch 26 is connected between the inverting input 18 and the output terminal 16 of the operational amplifier 14. It includes a pair of output terminals 28 and 30 for connecting the load 12 in series in the feedback circuit branch 26.

The invention, as illustrated in FIG. 1, has a unique combination of voltage divider resistors R1 and R2, input resistor R3, and the connection of the load between the output 16 of the operational amplifier 14 and the inverting input 18 of the operational amplifier 14. When the voltage at the inverting input 18 is swinging in one polarity, the voltage at the output terminal 16 is swinging in the opposite polarity. Consequently, the voltage appearing across the load 12 is the sum of the voltage at the output 16 of the operational amplifier 14 at one polarity added to the input voltage at the inputs 18 and 20 to the operational amplifier 14 in the opposite polarity. As in the prior art, the output voltage of the operational amplifier 14 is limited to a value less than the power supply voltage appearing at the power supply input terminals 32 and 34. However, because the voltage at the output terminals 28 and 30 is the sum of the opposite polarity voltages at the output 16 and the input 18, the total voltage at the load 12 may have an absolute value considerably greater than the absolute value of the voltage at either of the power supply terminals 32 and 34. Typically, for example, operational amplifier circuitry with ±15 volt supplies may be limited at the input and output terminals to voltage swings on the order of ±10 or ±11 volts. For the circuit of the present invention, the sum of these maximum voltages, which are permissible while maintaining accurate linear operation, are on the order of ±20 or ±21 volts.

Figure 2:
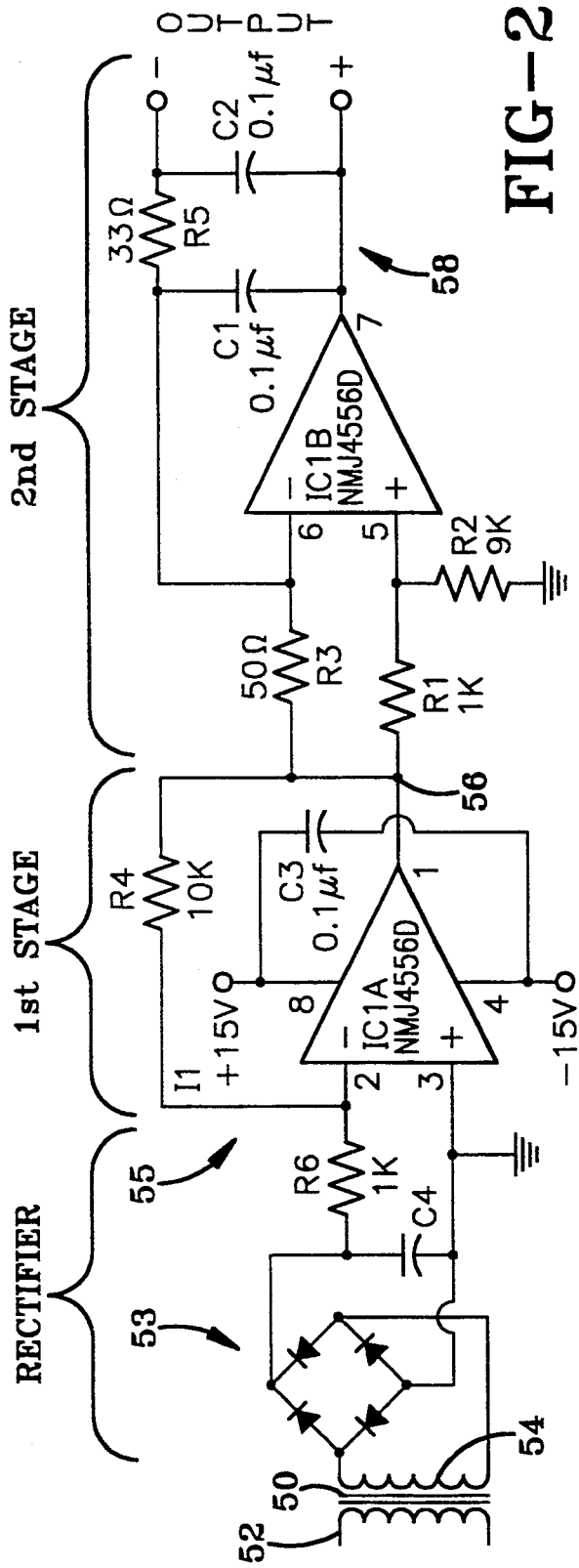
FIG. 2 is a schematic diagram of a practical embodiment of the invention which is simplified to illustrate its operation.

FIG. 2 illustrates a practical embodiment of the present invention which has been simplified from the preferred embodiment by eliminating circuit features which are unrelated to the present invention. In this embodiment, a current transformer 50 has a primary winding 52 connected to an AC electrical power circuit and has a secondary 54 connected to the input of a signal conditioning circuit comprising a rectifier 53 and a first stage conventional, operational amplifier circuit 55.

The rectifier 53, full wave rectifies the 60 Hz sinusoidal signal from the secondary 54 of the transformer 50. The rectifier output is filtered in the conventional manner by an RC filter consisting of resistor R6 and capacitor C4, to provide to the input of the first stage 55 a DC voltage which is essentially proportional to the rms value of the AC current through the primary 52 of the transformer 50. The first stage amplifier 55 provides the conventional, low input impedance to the output of the rectifier 53 and applies a low output impedance voltage source to the input terminal 56 of the second stage amplifier which embodies the present invention.

The second stage amplifier is illustrated in FIG. 2 as identical to the schematic in FIG. 1, with the exception that a low pass filter 58 of conventional design is additionally connected at its output. This low pass filter consists of capacitors C1 and C2, connected in a $\pi$ configuration with resistor R5. The low pass filter suppresses high frequency transients, such as transient spikes induced by lightning, to increase the surge withstanding capability of the circuit. Capacitors C1 and C2 also increase the margin of stability by retarding the possibility of oscillation in the event that the load has a small inductive component.

The transfer function for the circuit of the present invention is:

$$I_{OUT} = \frac{E_{IN}}{R3}\left[1 - \frac{R2}{R1 + R2}\right] \qquad \text{I.}$$

where:

$E_{IN}$ = the input voltage illustrated in FIG. 1
$I_{OUT}$ = the output current Consequently, the resistances of resistors R1, R2 and R3 may be chosen to give the desired design transconductance in accordance with the transfer function. In addition to determining the gain, there are other constraints and limitations upon the resistance values selected for these resistors. Since a well known design approximation in dealing with an operational amplifier is that the voltage between the inverting and noninverting inputs to the operational amplifier is essentially 0 volts, the voltages across R1 and R3 are essentially equal. Since these voltages are equal, the value of R3 must be chosen in accordance with the desired compliance voltage and maximum or full scale output current so that the resistance of R3 will be:

$$R3 = \frac{R_{IN}}{I_{OUT}}\left[1 - \frac{R2}{R1 + R2}\right] \qquad \text{II.}$$

In equation II, $E_{IN}$ is the input voltage and $I_{OUT}$ is the output current. In selecting values during design, the ratio $E_{IN}/I_{OUT}$ can be chosen as the ratio of the maximum input voltage to the desired maximum or full scale output current.

While the absolute values of the resistors R1 and R2 are not critical since they are operating as a voltage divider, there are some limitations upon them. The sum R1+R2 of their resistances should not be so low that significant power is wasted or that the preceding stage can not drive them. Essentially all output current should flow through resistor R3. Additionally, the resistance of resistors R1 and R2 should not be so high that input bias current, typically on the order of microamps or tenths of microamps, causes a noticeable voltage drop across the resistor R1 and thereby introduces inaccuracies into the output signal.

Consequently, the maximum input voltage $E_{IN}$ divided by the sum of the resistances R1+R2 should be much greater than the input terminal bias current $I_B$ of the operational amplifier. For typical applications, the sum of R1+R2 ordinarily should not exceed approximately 100 K ohms. Similarly, the typical circuit should not operate at full scale output current below approximately 10 microamps or else the bias current becomes a significant factor reducing accuracy.

Thus, for a typical transducer circuit having the two stages illustrated in FIG. 2, the first conventional stage has a gain of ten. Therefore, a ±1 volt input to the first stage would provide a ±10 volt output, which in turn would provide a typical output current of ±20 milliamps. In this circuit the typical compliance voltage would be approximately ±20 volts, thus permitting a load resistance of 1 K ohm or less while maintaining a highly accurate, linear operation in accordance with the transfer function of equation I.

Figure 3:
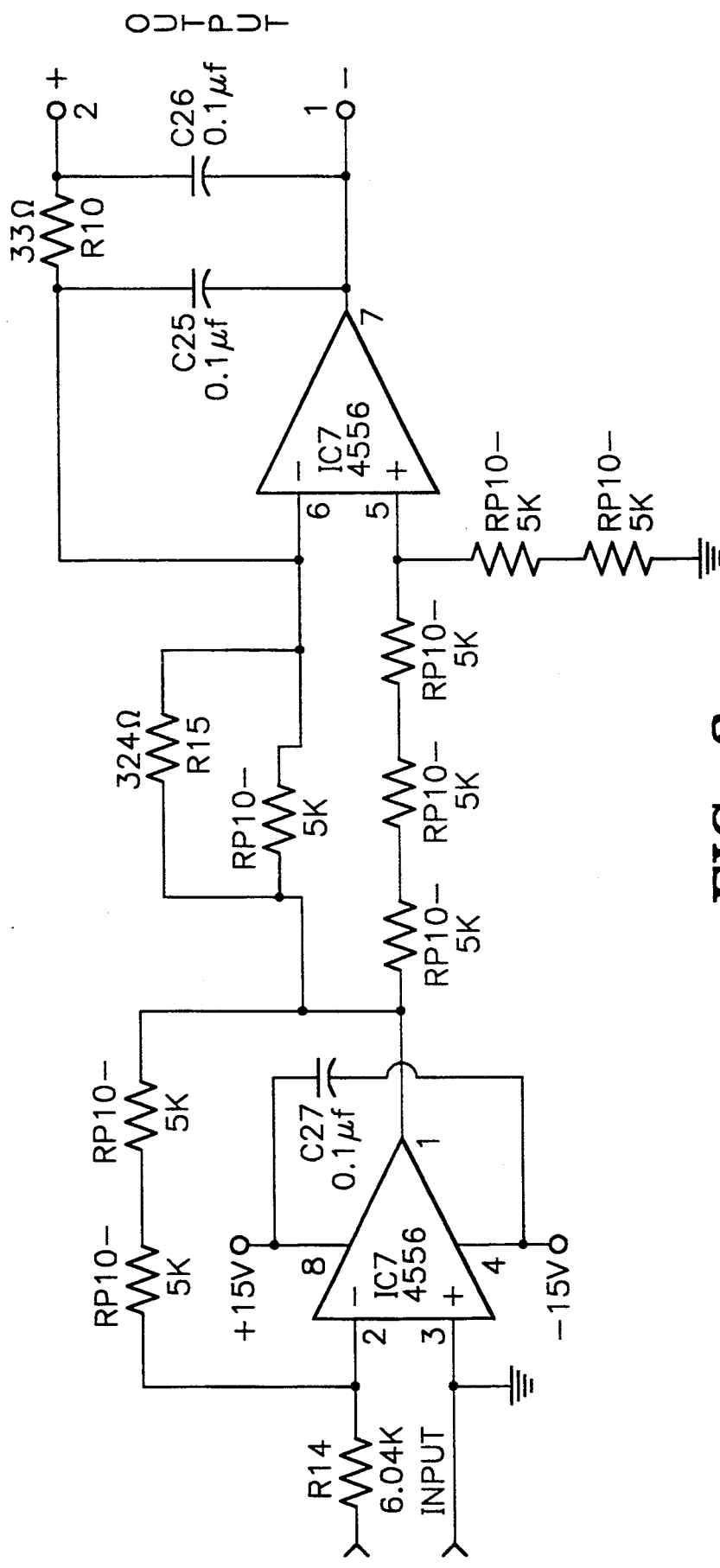
FIG. 3 is a schematic diagram of the preferred embodiment of the invention.

FIG. 3 illustrates the preferred embodiment of the invention. It contains modifications which are preferred for minimizing costs. For example, the circuit illustrates use of multiple, series, 5 K ohm resistors designated RP 10 used in place of single discrete resistors. Such resistors are commercially available in a "resistor pack" in which multiple, identical resistors are contained in one package and can be connected in series to form effective resistors having a value which is the sum of the series connected resistors. Elements R10, C25, and C26, while not required for this invention, were included in the preferred embodiment as a low pass filter to keep electrical noise and transients from external sources from coupling into and damaging the op-amp. Capacitors C25 and C26 also increase the frequency stability margin of the circuitry when driving various impedance loads. Resistor R15 was parallelled with a 5 K ohm resistor in the resistor pack to provide an appropriate calibration factor. The parallel combination of resistor R15 and 5 k ohm resistor RP 10 could be replaced with a single resistor of the equivalent value.

While certain preferred embodiments of the present invention have been disclosed in detail, it is to be understood that various modifications may be adopted without departing from the spirit of the invention or scope of the following claims.

I claim:

1. A bidirectional, transconductance mode DC amplifier exhibiting a compliance voltage exceeding each of the DC power supply voltages and having an input terminal connected to a voltage source, the amplifier comprising:
    (a) a differential input, operational amplifier having an output, an inverting input and a non-inverting input;
    (b) a voltage divider having a first impedance connected between said input terminal and said non-inverting input and a second impedance connected between said non-inverting input and a common;
    (c) a third impedance connected between said input terminal and said inverting input; and
    (d) a feedback circuit branch connected between said inverting input and said operational amplifier output and including a pair of output terminals interposed in the feedback circuit branch for connecting a load interposed in series in the feedback circuit branch wherein the amplifier exhibits a compliance voltage exceeding each of the DC power supply voltages.

2. An amplifier in accordance with claim 1 wherein the impedance value of said third impedance is substantially equal to $$\frac{E_{IN}}{I_{OUT}}\left[1 - \frac{R2}{R1 + R2}\right]$$

wherein
    $E_{IN}$=the voltage of said voltage source
    $I_{OUT}$=the output current
    R1=the impedance value of said first impedance
    R2=the impedance value of said second impedance.

3. An amplifier in accordance with claim 2 wherein:

$$\frac{E_{IN}}{R1 + R2} >> I_B$$

wherein $I_B$=the operational amplifier input terminal bias current.

4. An amplifier in accordance with claim 1 wherein said voltage source comprises a low output impedance amplifier.

5. An amplifier in accordance with claim 1 wherein said voltage source comprises:
    (a) at least one transformer having a primary connected to an AC electrical power circuit for metering a power circuit parameter and having a secondary; and
    (b) a signal conditioning circuit for converting at least one alternating electrical signal to a DC signal which is proportional to the power circuit parameter and having its input connected to the secondary of the transformer and its output connected to said input terminal of said DC amplifier.

6. An amplifier in accordance with claim 5 wherein the impedance value of said third impedance is substantially equal to $$\frac{E_{IN}}{I_{OUT}}\left[1 - \frac{R2}{R1 + R2}\right]$$

wherein:
    $E_{IN}$=the voltage of said voltage source
    $I_{OUT}$=the output current
    R1=the impedance value of said first impedance
    R2=the impedance value of said second impedance.

7. An amplifier in accordance with claim 6 wherein:

$$\frac{E_{IN}}{R1 + R2} >> I_B$$

wherein $I_B$=the operational amplifier input terminal bias current.

8. A transducer circuit for metering a parameter of an electrical power circuit, the transducer comprising:
    (a) a transformer for metering a power circuit parameter and having a primary connected to an AC electrical power circuit and having a secondary;
    (b) a signal conditioning circuit for converting at least one alternating electrical signal to a DC signal at an output which is proportional to the power circuit parameter and having an input connected to the secondary of the transformer; and (c) a second stage amplifier comprising:
  (i) a differential input, operational amplifier having an output, an inverting input and a non-inverting input;
  (ii) a voltage divider having a first impedance connected between the output of said conditioning circuit and said non-inverting input and a second impedance connected between said non-inverting input and a common;
  (iii) a third impedance connected between the output of said conditioning circuit and said inverting input; and
  (iv) a feedback circuit branch connected between said inverting input and said operational amplifier output and including a pair of output terminals interposed in the feedback circuit branch for connecting a load interposed in series in the feedback circuit branch.

9. An amplifier in accordance with claim 8 wherein the impedance value of said third impedance is substantially equal to $$\frac{E_{IN}}{I_{OUT}}\left[1 - \frac{R2}{R1 + R2}\right]$$

wherein
  $E_{IN}$ = the voltage of said voltage source
  $I_{OUT}$ = the output current
  R1 = the impedance value of said first impedance
  R2 = the impedance value of said second impedance.

10. An amplifier in accordance with claim 9 wherein:

$$\frac{E_{IN}}{R1 + R2} >> I_B$$

wherein $I_B$ = the operational amplifier input terminal bias current.

* * * * *